United States Patent
Ogane

[11] Patent Number: 6,104,635
[45] Date of Patent: Aug. 15, 2000

[54] NON-VOLATILE MEMORY DEVICE READABLE WRITE DATA LATCH, AND INTERNAL CONTROL THEREOF

[75] Inventor: Junichi Ogane, Tokyo, Japan

[73] Assignee: Oki Electric Industry Co., Ltd., Tokyo, Japan

[21] Appl. No.: 09/143,447

[22] Filed: Aug. 20, 1998

[30] Foreign Application Priority Data

Nov. 17, 1997 [JP] Japan ..................... 9-314924

[51] Int. Cl.[7] ............ G11C 14/00; G11C 16/04; G11C 16/06
[52] U.S. Cl. ............... 365/185.08; 365/185.04; 365/185.21; 365/185.28; 365/185.33
[58] Field of Search ......... 365/185.04, 185.08, 365/185.12, 185.17, 185.21, 185.28, 185.33

[56] References Cited

U.S. PATENT DOCUMENTS

| | | | |
|---|---|---|---|
| 5,488,579 | 1/1996 | Sharma et al. | 365/185.08 |
| 5,828,600 | 10/1998 | Kato et al. | 365/185.11 |
| 5,835,414 | 11/1998 | Hung et al. | 365/185.25 |

*Primary Examiner*—Trong Phan
*Attorney, Agent, or Firm*—Jones, Volentine, Steinberg, & Whitt, LLP

[57] ABSTRACT

A non-volatile semiconductor memory device has a data latch that stores data to be written into memory cells, and functions as a sense amplifier for data read from the memory cells. Read data and write data have opposite polarities in the data latch. A data polarity control circuit in the memory device generates a selection signal indicating whether the data latch stores read data or write data. A data polarity switch generates externally readable data by outputting read data stored in the data latch, and by inverting write data stored in the data latch.

22 Claims, 9 Drawing Sheets

NON-VOLATILE MEMORY DEVICE READABLE WRITE DATA LATCH, AND INTERNAL CONTROL THEREOF

BACKGROUND OF THE INVENTION

The present invention relates to a non-volatile semiconductor memory device with a data latch that stores both read data and write data.

Non-volatile read/write memory devices such as flash memory devices employ two methods, hot-electron injection and Fowler-Nordheim tunneling, to store and erase data in their memory cells. Fowler-Nordheim tunneling is the slower method, taking a few hundred to a few thousand microseconds to write data that could be written in a few tens of microseconds by hot-electron injection. Nevertheless, for low-power memory devices, Fowler-Nordheim tunneling is an attractive data-writing method because it draws very little current, enabling the necessary writing voltages to be generated within the memory device.

The slowness of Fowler-Nordheim tunneling write operations can be hidden by providing each bit line in the memory device with a latch for holding write data. When write data have been stored in all of the latches, one word line is activated, and the data are written all at once into the memory cells coupled to the word line. To an external device sending write data to the memory device, the write cycle time becomes the time needed to store the data in the write latches, which is the same regardless of the method employed to write the data into the memory cells.

In flash memory devices specialized for serial access, including flash memory devices used in digital still cameras and flash memory modules used as replacements for rotating-disk storage devices, to simplify the memory circuit, the same latches are often made to function as sense amplifiers in data read operations. Read data from all memory cells coupled to a designated word line are sensed and amplified simultaneously by the latches. After sense amplification, the latches become a cache from which the read data can be accessed quickly, without further sense amplification, in a manner similar to fast page mode read access in a dynamic random-access memory (DRAM).

It would be convenient if write data held in the latches could also be read in this way while awaiting transfer to the memory cells. This is particularly desirable in memory devices that write data by Fowler-Nordheim tunneling and therefore require lengthy residence of write data in the data latches. When Fowler-Nordheim tunneling is used for writing with common flash memory architectures such as the NOR architecture and the AND architecture, however, the polarity of write data stored in the latches is opposite to the polarity of read data, so the write data cannot be read correctly.

Conventional flash memories that attempt to implement a DRAM-like external interface therefore require both sense amplifiers for amplifying and caching read data, and separate latches for caching write data, with resultant penalties in device size and cost. Conversely, conventional flash memories that use sense amplifiers as write data latches cannot provide read access to write data stored in the latches; read access must wait until the data have actually been stored in the memory cells. With Fowler-Nordheim tunneling in particular, the wait may be long.

SUMMARY OF THE INVENTION

It is accordingly an object of the present invention to enable a non-volatile semiconductor memory device to use the same data latches for caching both read data and write data, providing read access to the cached write data.

The invented semiconductor memory device has non-volatile memory cells, and one or more data latches for storing both write data to be written into the memory cells and read data read from the memory cells. A data polarity control circuit generates a selection signal indicating whether the data stored in the data latches are read data or write data. A data polarity switch generates externally readable data by outputting the data stored in the data latches when the selection signal indicates that read data are stored, and inverting the data stored in the data latches when the selection signal indicates that write data are stored. Write data are preferably stored in the memory cells by Fowler-Nordheim tunneling. The data latches preferably function as sense amplifiers when data are read from the memory cells. The selection signal is preferably reset when the memory device is powered up.

The invented method of controlling the above semiconductor memory thus comprises the steps of:

generating a selection signal indicating whether the data stored in the data latches are read data or write data;

generating externally readable data by outputting read data stored in the data latches; and generating externally readable data by inverting write data stored in the data latches.

DETAILED DESCRIPTION OF THE INVENTION

Embodiments of the invention will be described with reference to the attached illustrative drawings. Relevant prior art will also be described.

Figure 1:
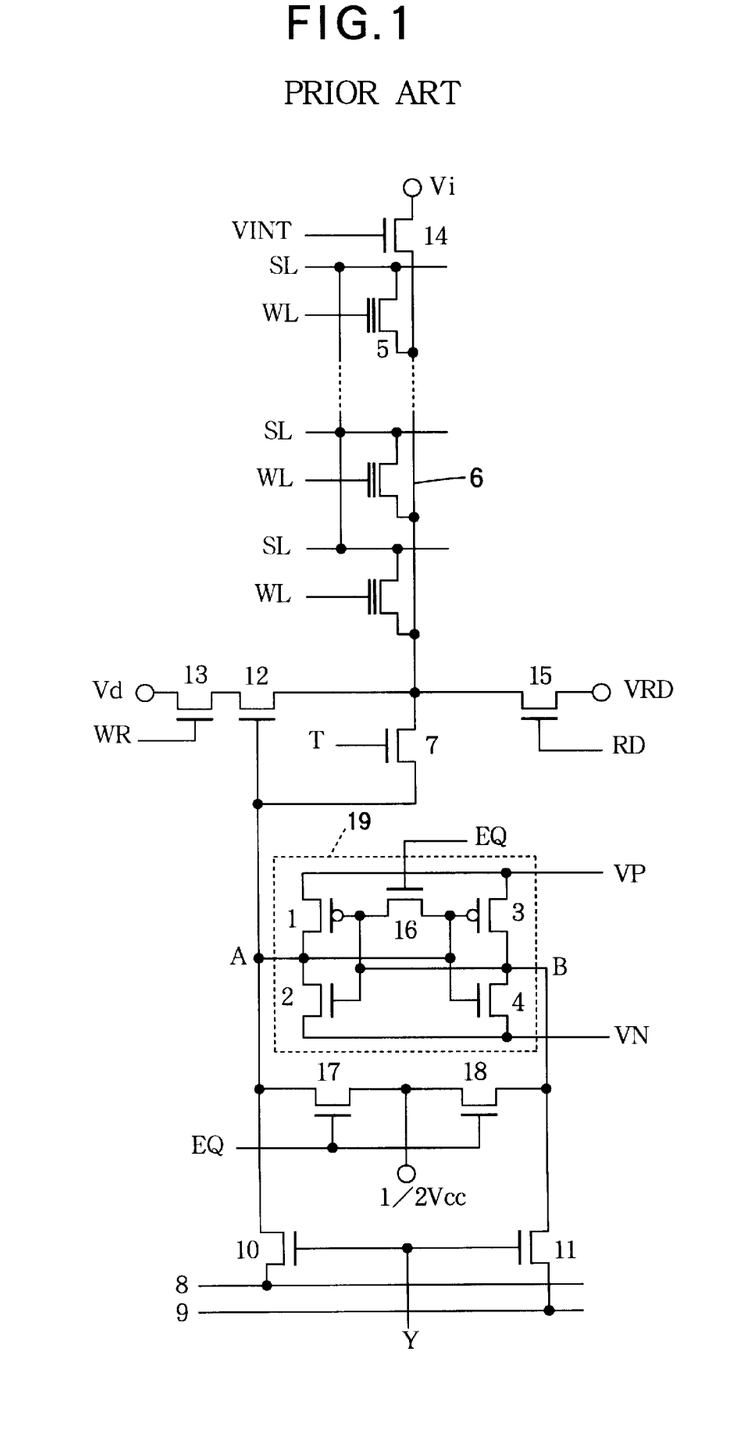
FIG. 1 is a circuit diagram of a bit line and data latch in a conventional flash memory.

FIG. 1 shows one bit line 6 and associated circuitry in a flash memory device with a NOR memory-cell architecture, employing Fowler-Nordheim tunneling for writing data. The associated circuitry comprises transistors 1 to 5 and 7, two complementary data lines 8 and 9, and further transistors 10 to 18. Transistors 1 and 3 are p-channel metal-oxidesemiconductor (PMOS) transistors. The other transistors are n-channel metal-oxide-semiconductor (NMOS) transistors. These circuit elements are found both in the present invention and in prior-art flash memory devices.

Transistors 1, 2, 3, 4, and 16 constitute a data latch 19 that also operates as a sense amplifier. The source electrodes of transistors 1 and 3 are coupled to a power supply node VP. The source electrodes of transistors 2 and 4 are coupled to a ground node VN. The drain electrodes of transistors 1 and 2 and the gate electrodes of transistors 3 and 4 are coupled in common to a data node A. The drain electrodes of transistors 3 and 4 and the gate electrodes of transistors 1 and 2 are coupled in common to a complementary data node B. The gate electrodes of transistors 1 and 3 are mutually interconnected through transistor 16, the gate electrode of which receives an equalize signal EQ.

Transistor 5, which constitutes a memory cell, has two gate electrodes, one coupled to a word line WL, the other floating. The source electrode of transistor 5 is coupled to a source line SL. The drain electrode of transistor 5 is coupled to bit line 6. Other memory cells are similarly coupled to bit line 6 and to respective word lines and source lines.

The bit line 6 is coupled to node A of the data latch 19 through a transfer transistor 7, the gate electrode of which receives a transfer signal T. Node A is coupled through transistor 10 to data line 8, and node B through transistor 11 to data line 9. The gate electrodes of transistors 10 and 11 are controlled by a decoded address signal Y.

A write potential Vd is supplied through transistors 12 and 13 to the end of bit line 6 near transfer transistor 7. Transistors 12 and 13 are coupled in series. The gate electrode of transistor 13 receives a write signal WR. The gate electrode of transistor 12 is coupled to node A.

An initial potential or write inhibit potential Vi is supplied through transistor 14 to the end of bit line 6 distant from transfer transistor 7. The gate electrode of transistor 14 receives an initializing signal VINT.

A read potential VRD is supplied through transistor 15 to the end of bit line 6 near transfer transistor 7. VRD is intermediate between Vcc and ½Vcc, where Vcc is a power-supply potential representing the binary '1' logic level or high logic level. The gate electrode of transistor 15 receives a read signal RD.

A potential equal to ½Vcc is supplied to nodes A and B through transistors 17 and 18, respectively. The gate electrodes of transistors 17 and 18 receive the equalize signal EQ.

Before data are written into a memory cell 5, the memory cell is erased to the logic '1' state by applying voltages that cause electrons to tunnel into its floating gate. The negative charge thus stored in the floating gate raises the transistor on-off discrimination point of the memory cell 5 from a value $V_0$ (such as ½Vcc), which would obtain in the absence of a floating gate charge, to a higher value $V_0+\delta_1$, where $\delta_1$ is, for example, about half a volt.

New data that will be written into a memory cell 5 are first stored in the data latch 19. The write data are placed on the complementary data lines 8 and 9. If a '0' is to be stored, data line 8 is driven to the high logic level (Vcc) and data line 9 to the low logic level or ground level (Vss). If a '1' is to be stored, data line 8 is driven to the low logic level (Vss), and data line 9 to the high logic level (Vcc). The address signal Y is placed at the high logic level, so that the node A is driven to the same potential as data line 8, and node B to the same potential as data line 9. In addition, node VP is driven to Vcc, and node VN is driven to Vss, so nodes A and B are held at their existing potential levels even after the address signal Y goes low. Node A thus remains high (Vcc) if the write data value is '0,' and low (Vss) if the write value is '1.'

Figure 2:
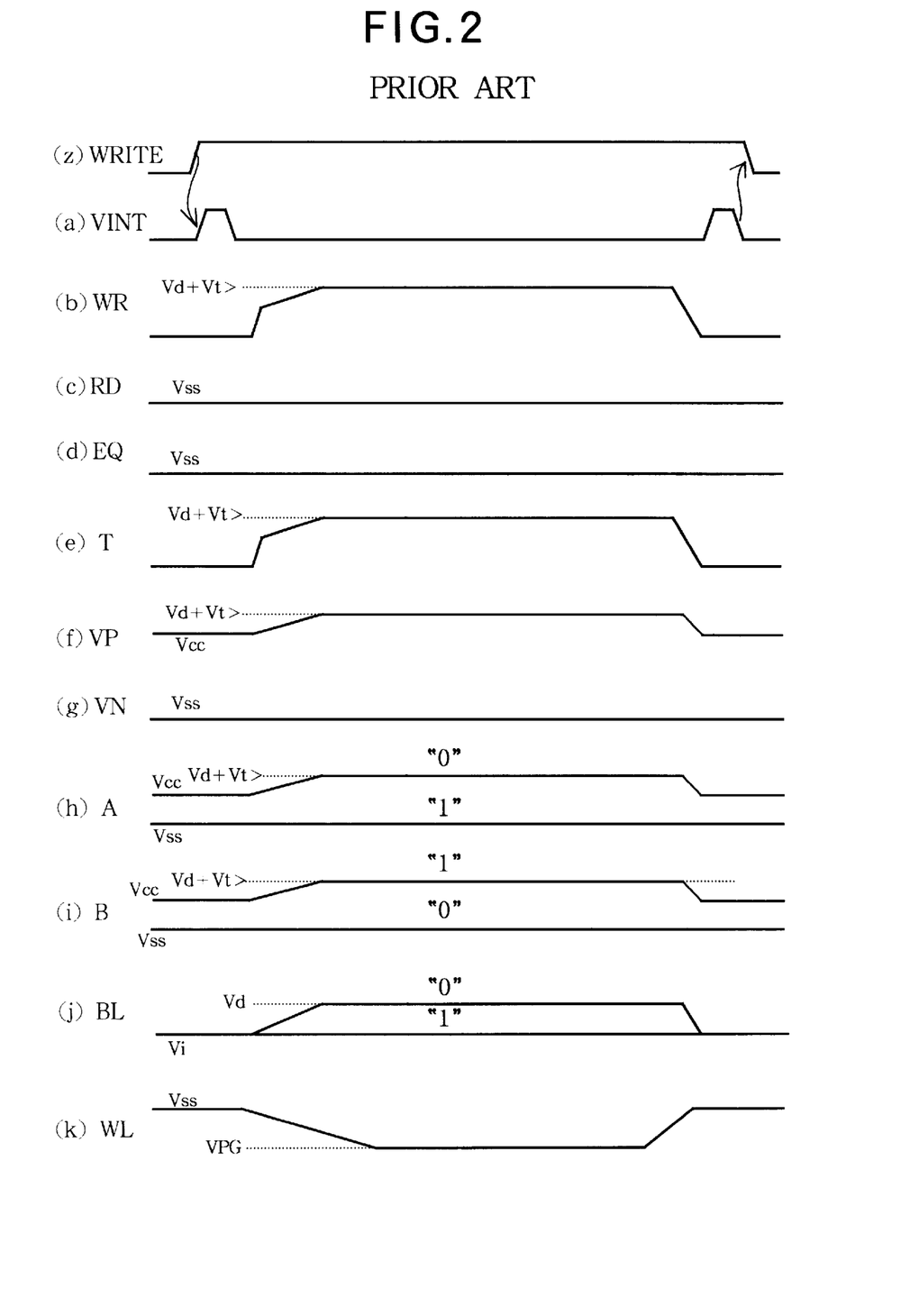
FIG. 2 is a waveform diagram illustrating the writing of data into a memory cell in FIG. 1.

After the memory cell 5 has been erased and the new write data have been placed in the data latch 19, the new data are stored in memory cell 5 by the procedure illustrated in FIG. 2. The write operation takes place during an interval defined by a master write signal (waveform z) generated by a control circuit not shown in FIG. 1. This control circuit also generates the above-mentioned VINT, WR, RD, EQ, and T signals, and controls the VP, VN, and word-line (WL) potentials. All of these signals and potentials are initially at the ground level (Vss) except for VP, which is initially at the high logic level (Vcc). Throughout the write operation, the RD and EQ signals and VN potential remain at the ground level (waveforms c, d, and g), and the source line (SL, not shown in FIG. 2) of the memory cell 5 is left in the high-impedance state.

When the master write signal goes high, VINT is also driven to the active or high level (waveform a), briefly turning on transistor 14 and precharging bit line 6 (BL, waveform j) to the write inhibit potential Vi. After VINT goes low, the WR and T signals (waveforms b and e) are first driven to the active or high level (Vcc); then WR, T, and VP (waveform f) are driven to a still higher voltage level equal to or greater than Vd+Vt, where Vt is the threshold voltage of transistors 7, 12, and 13. At the same time, a negative programming voltage VPG is applied to the word line (WL, waveform k)

As a result, if a '0' is stored in the data latch 19, node A rises from Vcc to a potential equal to or greater than Vd+Vt (waveform h) while node B remains at Vss (waveform i). Transistors 12 and 13 are both turned on, with Vd+Vt applied to their gate electrodes, allowing the write potential Vd to pass through to the bit line 6 (waveform j). The potential difference between Vd on the bit line and VPG on the word line is sufficient to force electrons to tunnel out of the floating gate of memory cell 5, thereby lowering the transistor on-off discrimination point of memory cell 5 to a value $V_0-\delta_2$, where $\delta_2$ is, for example, about half a volt.

If a '1' is stored in the data latch 19, then node A stays at the Vss potential, so transistor 12 remains turned off, and the bit line 6 remains at the write inhibit potential Vi. The potential difference between Vi and VPG is insufficient for tunneling to take place, so the threshold voltage of the memory cell remains $V_0+\delta_1$.

At the end of the write operation, VP returns to the Vcc level, WR and T return to the Vss level, and VINT is driven high again (waveform a) to precharge the bit line 6 to the Vi potential once more.

Figure 3:
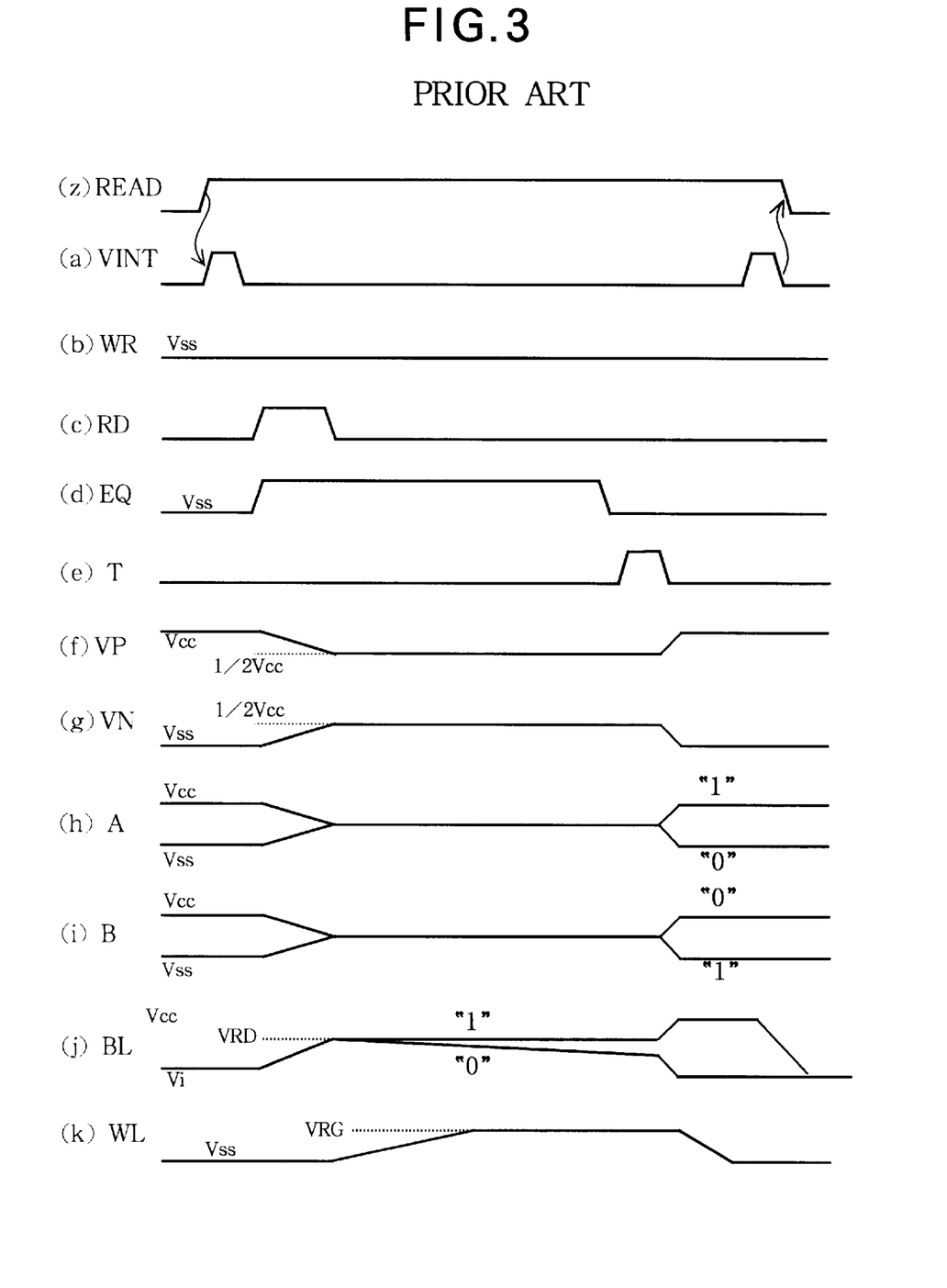
FIG. 3 is a waveform diagram illustrating the reading of data from a memory cell in FIG. 1.

FIG. 3 illustrates the operation of reading data from memory cell 5. The read operation is controlled by a master read signal (waveform z). Waveforms a–k designate the same signals as in FIG. 2. During the read operation, the source line (SL, not shown in FIG. 3) is held at the ground potential (Vss).

At the beginning of the read operation, VINT is driven to the active (high) level to precharge the bit line 6 to the initial Vi potential (waveforms a and j). After VINT goes low, the RD signal is driven to the active (high) level to supply the VRD potential to the bit line (waveforms c and j). At the same time, VP and VN are both brought to ½Vcc and the equalize signal EQ is driven to the active (high) level, mutually short-circuiting nodes A and B through transistor 16, and supplying ½Vcc to nodes A and B through transistors 17 and 18 (waveforms d, f, g, h, and i).

When the bit line has reached the VRD potential, the word line (WL, waveform k) is driven to a read gate voltage VRG that is less than $V_0+\delta_1$ but greater than $V_0-\delta_2$. If a '1' is stored in memory cell 5, then VRG is less than the on-off discrimination voltage ($V_0+\delta_1$) of the memory cell, so its transistor remains turned off, and the bit line 6 remains at the VRD potential. If a '0' is stored in memory cell 5, however, then VRG exceeds the on-off discrimination voltage ($V_0-\delta_2$), so the memory-cell transistor turns on, and the bit line 6 begins to discharge toward the ground level of the source line.

At a certain time after word line WL reaches the VRG level, the potential of the bit line (waveform k) will have discharged to a potential less than ½Vcc if the memory cell 5 holds a '0,' but will still be at potential VRD, greater than ½Vcc, if the memory cell 5 holds a '1.' At this time, the equalize signal EQ is driven low and the transfer signal T is driven high (waveforms d and e), transferring the bit-line potential to node A, thus creating a potential difference between nodes A and B.

Next, signal T is driven low, VP is driven to Vcc, VN is driven to Vss (waveforms e, f, and g), and the potential difference between nodes A and B is amplified. If the memory cell 5 holds a '0,' then node A goes from a potential slightly below ½Vcc to Vss, while node B goes from ½Vcc to Vcc. If the memory cell 5 holds a '1,' then node A goes from a potential slightly above ½Vcc to Vcc, while node B goes from ½Vcc to Vss.

When signal T goes low, the word line WL is returned to the Vss level, then VINT is driven high to precharge the bit line to the Vi potential again (waveforms a, j, and k). The data stored in the memory cell 5 are now also stored in the data latch 19, available to be read out on the data lines 8 and 9.

As the above description shows, the read polarities of nodes A and B in data latch 19 are opposite to the write polarities. When storing write data, node A is high for a '0' and low for a '1,' while node B is low for a '0' and high for a '1.' When storing read data, however, node A is low for a '0' and high for a '1,' while node B is high for a '0' and low for a '1.' This difference prevents a conventional flash memory from providing read access to write data stored in the data latch 19.

Figure 4:
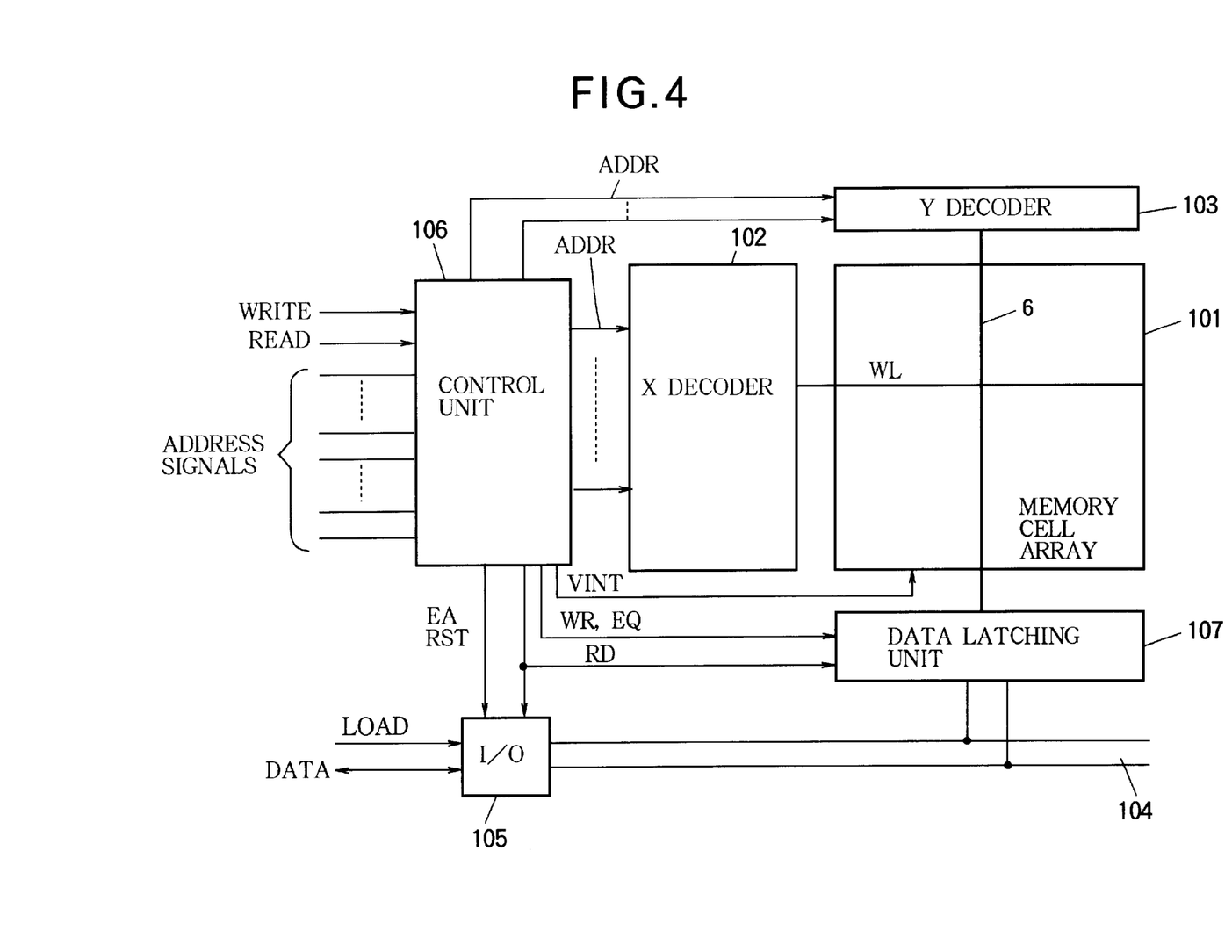
FIG. 4 is a block diagram of a flash memory device embodying the present invention.

FIG. 4 is a block diagram of a flash memory device embodying the present invention, comprising a memory cell array 101, an X decoder 102, a Y decoder 103, a pair of complementary data lines 104, an input/output (I/O) control unit 105, a control unit 106, and a data latching unit 107. The X decoder 102 selects word lines in the memory cell array 101. The Y decoder 103 selects bit lines in the memory cell array 101. Only one bit line 6 and one word line WL are shown, but the memory cell array 101 has a plurality of each. The bit lines 6 are coupled to respective data latches in the data latching unit 107, which store read data and write data as described above. The complementary data lines 104 couple the data latching unit 107 to the input/output control unit 105, which controls the input and output of data.

The control unit 106 receives an external read control signal, an external write control signal, and address signals; passes the address signals to the decoders 102 and 103; and generates various internal control signals, including the signals shown in the drawing, for the memory cell array 101, the input/output control unit 105, and the data latching unit 107. The input/output control unit 105 also receives an external LOAD signal indicating timings at which an external device sends write data to the input/output control unit 105. The LOAD signal may be generated by the external device itself (as shown), or by the control unit 106, in response to the external write signal, for example.

The control unit 106 preferably includes an address counter, enabling various modes of address generation other than external address input. For example, the control unit 106 may generate addresses autonomously, or an external device may furnish a block address and have the control unit 106 generate addresses within the block.

Figure 5:
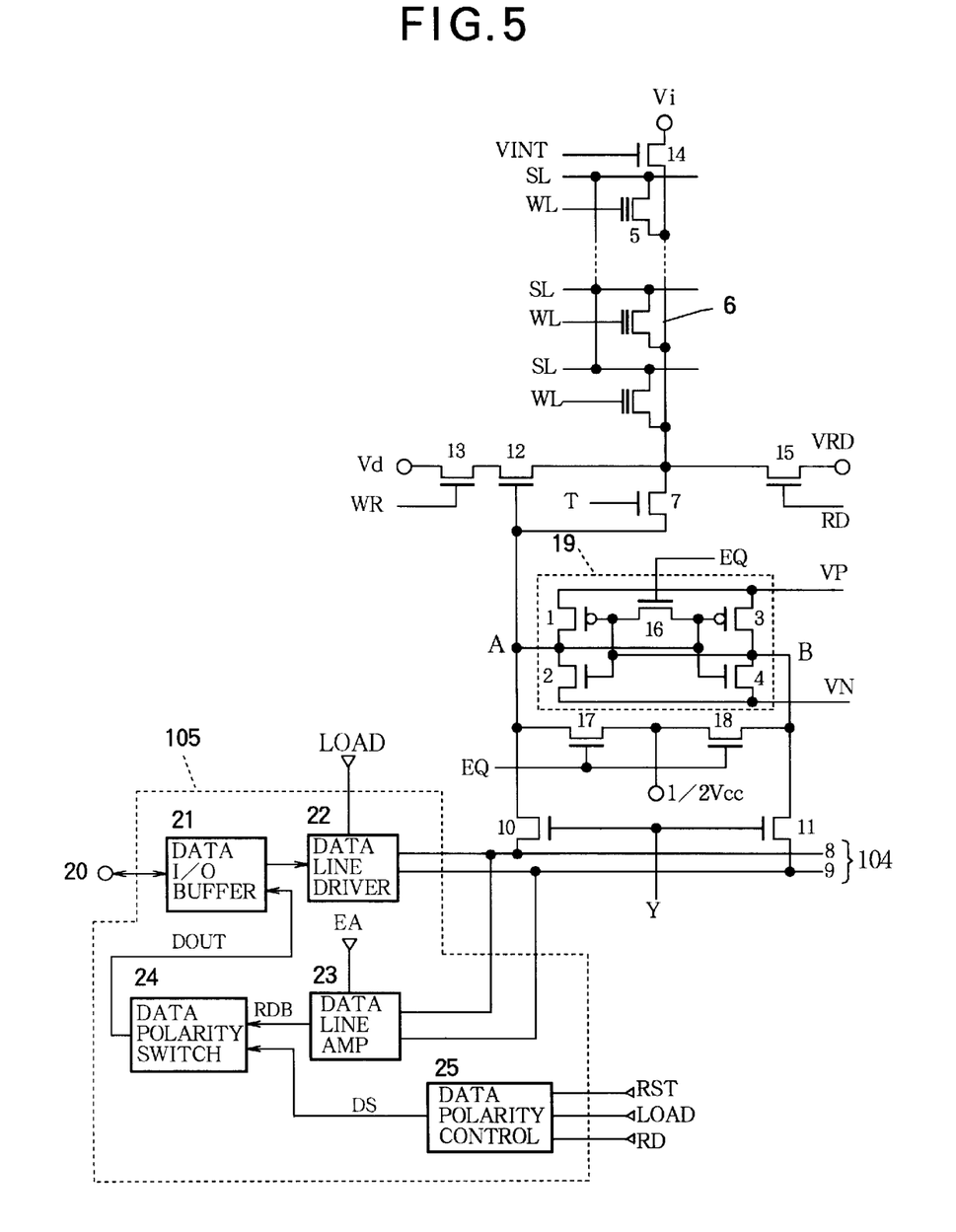
FIG. 5 is a circuit diagram showing a bit line, a data latch, and the input/output control unit in FIG. 4.

FIG. 5 shows one bit line 6 and related circuits in the memory cell array 101, input/output control unit 105, and data latching unit 107. Transistors 1 to 5 and 7, the two data lines 8 and 9 of the complementary pair of data lines 104, and transistors 10 to 18 are as already shown in FIG. 1. The data latch 19 and transistors 7, 10, 11, 12, 13, 15, 17, and 18 are disposed in the data latching unit 107 shown in FIG. 4. The circuits in the input/output control unit 105 include a data input/output terminal 20, a data input/output buffer 21, a data line driver 22, a data line amplifier (amp) 23, a data polarity switch 24, and a data polarity control circuit 25.

The LOAD signal is supplied to the data line driver 22 and data polarity control circuit 25. The data polarity control circuit 25 also receives the RD signal and a reset signal (RST) from the control unit 106, and supplies a data polarity selection signal (DS) to the data polarity switch 24. The data line amplifier 23 receives an amplifier enable signal (EA) from the control unit 106, and supplies a read data signal (RDB) to the data polarity switch 24. The data polarity switch 24 supplies output data (DOUT) to the data input/output buffer 21.

The data input/output buffer 21 comprises well-known circuits for amplifying write data signals received from the data input/output terminal 20, and amplifying the output data DOUT for output from the data input/output terminal 20.

Figure 6:
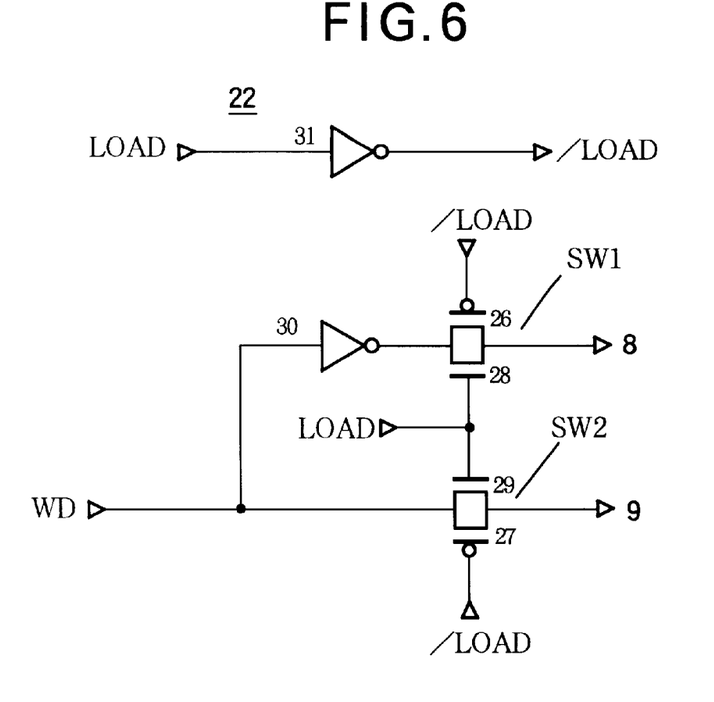
FIG. 6 is a more detailed circuit diagram of the data line driver in FIG. 5.

The data line driver 22 places input data signals on the complementary data lines 104. Referring to FIG. 6, the data line driver 22 has, for example, a pair of switches SW1 and SW2 comprising PMOS transistors 26 and 27 and NMOS transistors 28 and 29, a CMOS inverter 30 that inverts the write data WD, and a CMOS inverter 31 that inverts the LOAD signal to create an inverted /LOAD signal. CMOS, incidentally, stands for complementary metal-oxide-semiconductor.

The inverted /LOAD signal is supplied to the gate electrodes of PMOS transistors 26 and 27, while the non-inverted LOAD signal is supplied to the gate electrodes of NMOS transistors 28 and 29. When LOAD is high, all four transistors 26, 27, 28, and 29 turn on, the inverted write data signal is supplied through switch SW1 to data line 8, and the non-inverted data signal WD is supplied through switch SW2 to the complementary data line 9. When LOAD is low, transistors 26, 27, 28, and 29 are turned off, and the inverted and non-inverted write data signals are blocked at switches SW1 and SW2.

Figure 7:
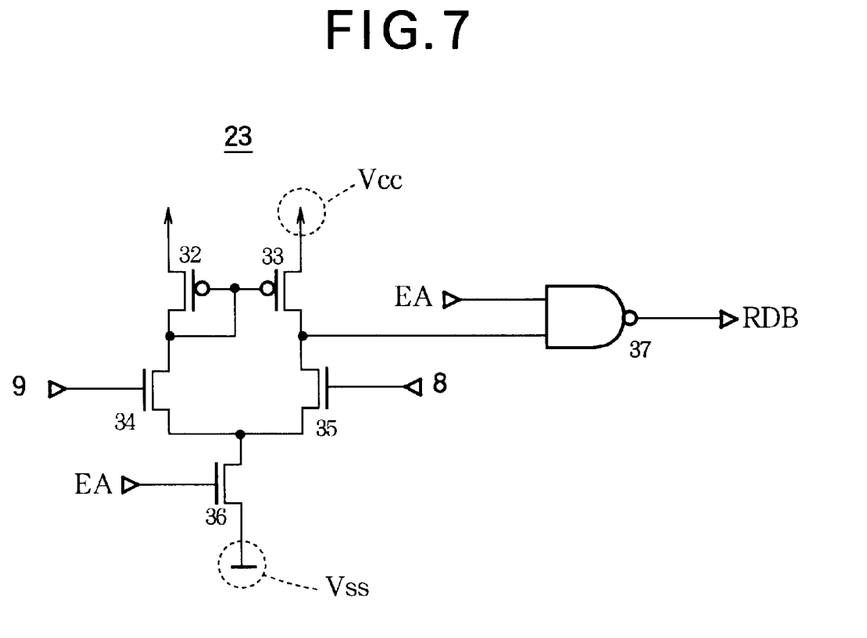
FIG. 7 is a more detailed circuit diagram of the data line amplifier in FIG. 5.

The data line amplifier 23 transfers data from the complementary data lines 104 to the data polarity switch 24. Referring to FIG. 7, the data line amplifier 23 has, for example, a differential amplifier circuit comprising PMOS transistors 32 and 33 and NMOS transistors 34, 35, and 36. The source electrodes of PMOS transistors 32 and 33 are coupled to the power supply (Vcc). The source electrode of NMOS transistor 36 is coupled to ground (Vss). The drain electrode of NMOS transistor 36 is coupled through transistor 34 to the drain electrode of transistor 32, which is coupled to the gate electrodes of transistors 32 and 33. The drain electrode of NMOS transistor 36 is also coupled through transistor 35 to the drain electrode of transistor 33, which is coupled to one input terminal of a CMOS NAND gate 37. The gate electrode of NMOS transistor 36 receives the amplifier enable signal EA, which is also supplied to NAND gate 37. Data lines 8 and 9 are coupled to the gate electrodes of transistors 35 and 34, respectively. NAND gate 37 outputs the read data signal RDB.

When the enable signal EA is low, the differential amplifier is inactive, but NAND gate 37 holds the read data signal RDB at the high level (Vcc). This avoids unwanted current flow in the data polarity switch 24, which might occur if RDB were left in an ambiguous state. When EA is high, the differential amplifier is activated, the read data signal RDB goes high if data line 8 is at a higher potential than complementary data line 9, and RDB goes low if data line 8 is at a lower potential than data line 9.

Figure 8:
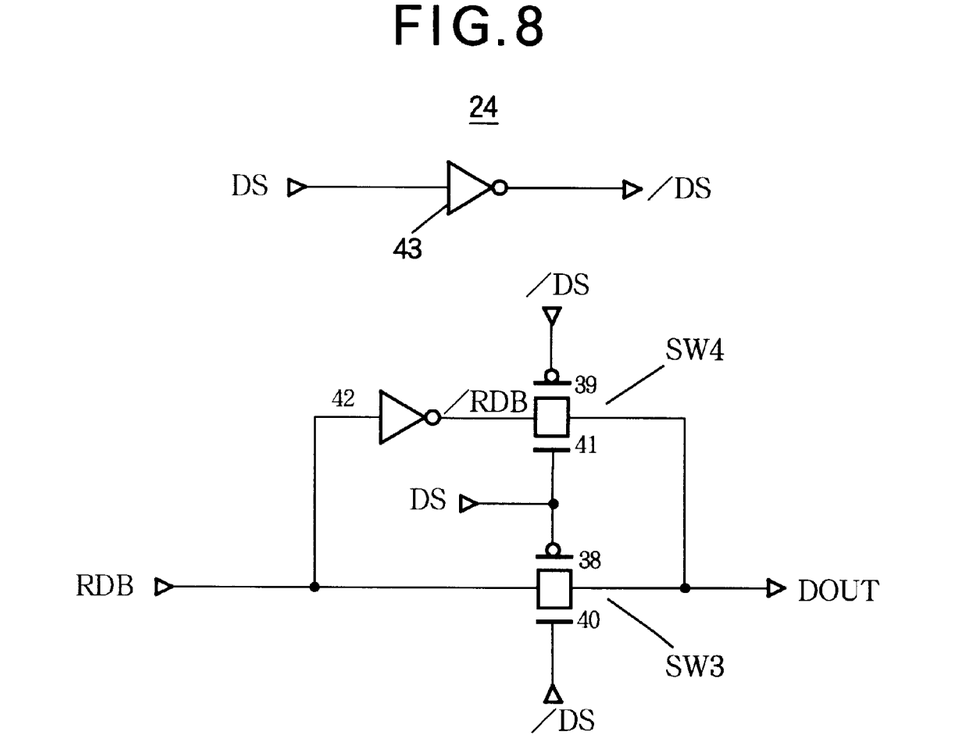
FIG. 8 is a more detailed circuit diagram of the data polarity switch in FIG. 5.

The data polarity switch 24 selects either RDB or an inverted read data signal /RDB, depending on the logic level of the data polarity selection signal DS. Referring to FIG. 8, the data polarity switch 24 has, for example, a pair of switches SW3 and SW4 comprising PMOS transistors 38 and 39 and NMOS transistors 40 and 41, a CMOS inverter 42 that inverts the read data RDB, and a CMOS inverter 43 that inverts the DS signal to create an inverted /DS signal. The DS signal is supplied to the gate electrodes of transistors 38 and 41, while the inverted /DS signal is supplied to the gate electrodes of transistors 39 and 40. When DS is high, transistors 39 and 41 turn on, supplying the inverted read data /RDB through switch SW3 as output data DOUT. When DS is low, transistors 38 and 40 turn on, supplying the non-inverted read data RDB through switch SW4 as output data DOUT.

Figure 9:
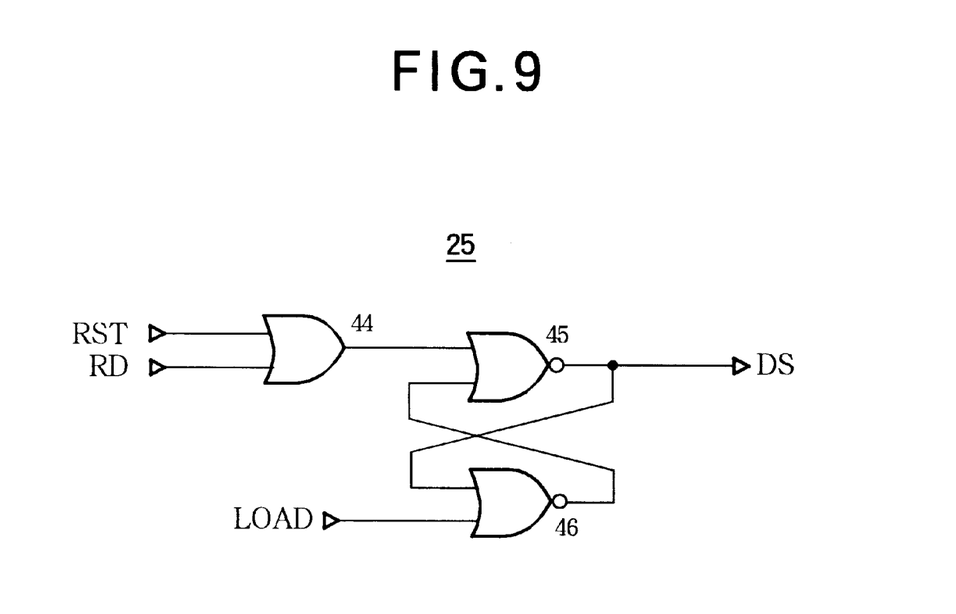
FIG. 9 is a more detailed circuit diagram of the data polarity control circuit in FIG. 5.

The data polarity control circuit 25 generates the data polarity selection signal DS. Referring to FIG. 9, the data polarity control circuit 25 has, for example, a CMOS OR gate 44 that receives the RD and RST signals, and a flip-flop circuit comprising cross-coupled CMOS NOR gates 45 and 46. NOR gate 45 receives the output of OR gate 44 and generates the data polarity selection signal DS. NOR gate 46 receives the LOAD signal. DS goes low when RST goes high, goes low when RD goes high, goes high when LOAD goes high, and remains unchanged when RST, RD, and LOAD are low.

Figure 10:
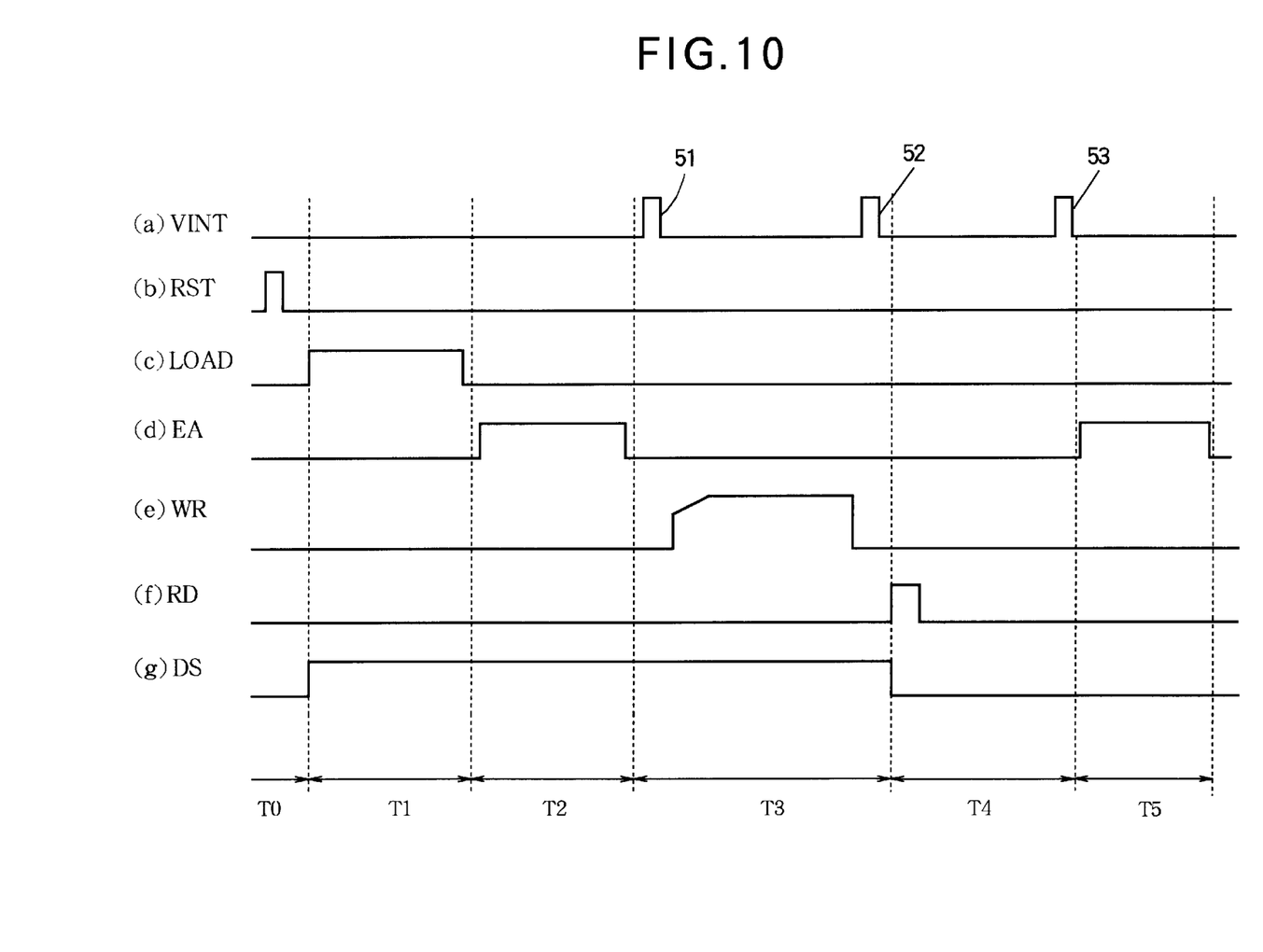
FIG. 10 is a waveform diagram illustrating read and write operations in the flash memory device in FIG. 4.

The operation of the flash memory depicted in FIGS. 4 to 9 will be described with reference to FIG. 10, which shows waveforms of the control signals during a write operation followed by a read operation after power-up.

During the power-up sequence, in time interval T0, the control unit 106 activates the reset signal RST for a brief time (waveform b). The high RST pulse assures that the data polarity selection signal DS is set to the low logic level (waveform g).

In the next interval T1, an external device sends write data to the flash memory device. The logic level of the write data is low for '0' and high for '1.' The LOAD signal goes to the active (high) level during this interval (waveform c). When LOAD goes high, the data polarity control circuit 25 sets the data polarity selection signal DS to the high logic level, and the data input/output buffer 21 sends write data received at the data input/output terminal 20 to the data line driver 22. Since the LOAD signal is high, the write data pass through the data line driver 22, which places the logic level of the write data on data line 9 and the complementary logic level on data line 8. The write data are then latched in the data latching unit 107 by activation of the Y address signal shown in FIG. 5. If the write data value is '0,' node A goes high and node B goes low. If the write data value is '1,' node A goes low and node B goes high.

In the next interval T2, the external device reads the data that have just been written. After determining, from address input signals for example, that the requested data are still held in the data latching unit 107, the control unit 106 activates the amplifier enable signal EA (waveform d). Signal Y in FIG. 5 is also activated. The data line amplifier 23 generates a read data signal RDB with the logic level of data line 8, that is, the logic level of node A, high for '0' and low for '1.' Since the data polarity selection signal DS is high, the data polarity switch 24 generates output data DOUT with the logic level of the inverted read data signal /RDB, thus low for '0' and high for '1.' The data input/output buffer 21 outputs the DOUT logic level from the data input/output terminal 20. The external device thus receives read data with the same logic level as the write data supplied in interval T1, low for '0' and high for '1.'

In the next interval T3, the write data held in the data latching unit 107 are written into the memory cell array 101. When the write instruction is given by the external device, the control unit 106 generates a high VINT pulse 51 (waveform a) to precharge the bit lines 6, then drives the WR signal and follows the procedure described in FIG. 2. The memory cells that will receive data are erased first, by a procedure not shown in the drawings, to set their on-off discrimination voltages to $V_0+\delta_1$. As explained in FIG. 2, the writing procedure changes the discrimination voltage of memory cells in which '0' data are written to $V_0-\delta_2$, while the discrimination voltage of memory cells in which '1' data are written remains $V_0+\delta_1$.

The memory cells to which data are written at this time may be all the memory cells coupled to a particular word line, referred to as a page or sector of memory cells, or an arbitrary portion of the page or sector, as selected by Y address signals. If so desired, a write operation can be performed to a single memory cell at a time.

The write operation concludes with another VINT pulse 52. Although stored in the memory cell array 101, the write data also remain held in the data latching unit 107, and can be read without delays for sense amplification, by the same procedure as in time interval T2.

In the next two intervals T4 and T5, the external device performs read access to data that are stored in the memory cell array 101 but not in the data latching unit 107. In interval T4, the data stored in the memory cells coupled to a word line designated by an X address are read into the data latching unit 107 by the procedure described in FIG. 3, node A going low for '0' data and high for '1' data. Since the bit lines 6 have already been precharged at the end of interval T3, the initial VINT pulse in FIG. 3 is omitted, and the RD signal goes high at the beginning of interval T4 in FIG. 10 (waveform f). The high RD pulse resets the data polarity control circuit 25, causing the data polarity selection signal DS to go low (waveform g). Interval T4 ends with a high VINT pulse 53.

In interval T5, the amplifier enable signal EA is driven to the high level, and the data now stored in one of the data latches 19, as designated by a Y address, are read from the data latching unit 107 onto the complementary data lines 104 and amplified by the data line amplifier 23. The amplified read data RDB, which have the same logic level as node A, pass through switch SW3 in the data polarity switch 24, as selected by the low DS signal, without being inverted. The data input/output buffer 21 therefore supplies the external device with a low logic level for '0' data and a high logic level for '1' data.

Read access to the other data stored in the data latching unit 107 can now be carried out by repeating the procedure in interval T5 with other Y addresses, without having to access the memory cell array 101.

As described above, the data polarity selection signal DS goes to one state whenever write data are loaded from an external device into the data latching unit 107, and to another state whenever read data are loaded from the memory cell array 101 into the data latching unit 107. Data polarity is switched by the DS signal so that at all times, an external device performing read access receives the correct data values. In particular, write data cached in the data latching unit 107 are available for rapid read access, either before or after the write data are stored in the memory cell array 101. The invented memory device provides this feature by means of a single data polarity switch 24 and data polarity control circuit 25, making the invented method more efficient than the conventional method of providing sense amplifiers and separate write data latches.

Figure 11:
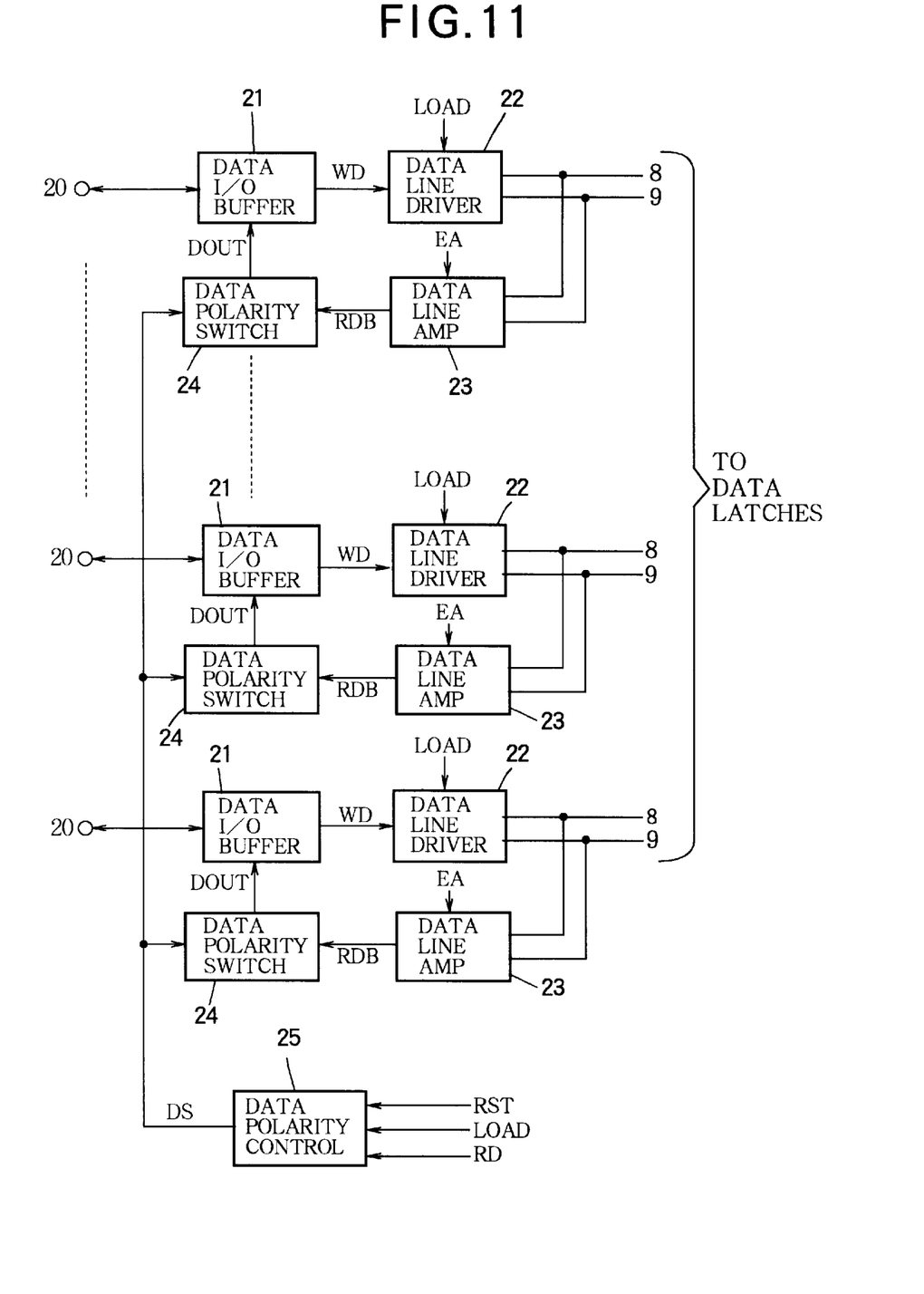
FIG. 11 is a block diagram of the input/output control unit in another flash memory device embodying the present invention.

The input/output control unit 105 in FIG. 5 is coupled to a single data input/output terminal 20, but the invention can also be practiced in a memory device having a plurality of data input/output terminals. Referring to FIG. 11, a separate data input/output buffer 21, data line driver 22, data line amplifier 23, and data polarity switch 24 and a separate pair of complementary data lines 8 and 9 are provided for each data input/output terminal 20. A single data polarity control circuit 25 provides a data polarity selection signal DS to all of the data polarity switches. The circuits in FIG. 11 operate as described in FIGS. 5 to 10, the data input/output buffers 21, data line drivers 22, data line amplifiers 23, and data polarity switches 24 operating in parallel.

The invention can also be practiced in memory devices with separate data input and data output terminals.

The circuit configurations shown in FIGS. 5 and 11, with a single data polarity control circuit 25, are suitable for memory devices having a single memory cell array, or having a plurality of memory cell arrays that operate in parallel. The memory cell arrays may be disposed on different semiconductor substrates. Conversely, if a memory device has a plurality of memory cell arrays disposed on a single semiconductor substrate, or on different substrates, and performs independent input/output control of the arrays, then a separate data polarity control circuit 25 may be provided for each memory cell array.

The data polarity control circuit 25 does not have to generate the data polarity selection signal DS from the LOAD and RD signals as shown in the preceding drawings. The DS signal can be generated from any signals that enable the data polarity control circuit 25 to detect the loading of write data into the data latching unit 107 from an external device, and the reading of data from the memory cells into the data latching unit 107. For example, the data polarity control circuit 25 can generate DS from an external write enable signal and the equalize (EQ) signal shown in FIG. 4. The reset signal (RST) may also be externally generated.

The internal circuit configurations of the data line driver 22, data line amplifier 23, data polarity switch 24, and data polarity control circuit 25 are not limited to the configurations shown in the drawings, and the invention is not limited to the NOR memory architecture and Fowler-Nordheim tunneling. For example, the invention can also be practiced in memory devices having an AND architecture, or using hot-electron injection to write data.

Those skilled in the art will recognize that further variations are possible within the scope claimed below.

What is claimed is:

1. A semiconductor memory device having a plurality of non-volatile memory cells, comprising:
   a data latch storing write data to be written into said memory cells, and storing read data read from said memory cells;
   a data polarity control circuit generating a selection signal indicating whether the data stored in said data latch are said read data or said write data; and
   a data polarity switch coupled to said data latch and said data polarity control circuit, generating externally readable data by outputting the data stored in said data latch when said selection signal indicates that said read data are stored, and by inverting the data stored in said data latch when said selection signal indicates that said write data are stored.

2. The semiconductor memory device of claim 1, wherein said data latch functions as a sense amplifier when said read data are read from said memory cells.

3. The semiconductor memory device of claim 1, wherein said write data are stored in said memory cells by Fowler-Nordheim tunneling.

4. The semiconductor memory device of claim 1, wherein said data polarity control circuit receives a first signal that becomes active each time said write data are transferred into said data latch, receives a second signal that becomes active each time said read data are transferred into said data latch, sets said selection signal to a first state when said first signal becomes active, leaves said selection in said first state until said second signal becomes active, sets said selection signal to a second state when said second signal becomes active, and leaves said selection in said second state until said first signal becomes active.

5. The semiconductor memory device of claim 4, wherein said data polarity control circuit comprises a flip-flop circuit.

6. The semiconductor memory device of claim 4, wherein said first signal is externally supplied.

7. The semiconductor memory device of claim 4, further comprising a bit line to which said memory cells are coupled, wherein said second signal is also used to supply a read potential to said bit line.

8. The semiconductor memory device of claim 4, wherein said data polarity control circuit sets said selection signal to a predetermined one of said first state and said second state when said semiconductor memory device is powered up.

9. The semiconductor memory device of claim 1, wherein said data polarity switch comprises:
   an inverter for inverting the data stored in said data latch;
   a first switch controlled by said selection signal, for selecting the data stored in said data latch; and
   a second switch controlled by said selection signal, for selecting an output of said inverter.

10. The semiconductor memory device of claim 1, comprising a plurality of bit lines to which said memory cells are coupled, one said data latch being provided separately for each of said bit lines.

11. The semiconductor memory device of claim 10, wherein said read data are transferable on all of said bit lines simultaneously, and said write data are transferable on all of said bit lines simultaneously.

12. The semiconductor memory device of claim 11, further comprising:
   a plurality of word lines to which said memory cells are coupled, said memory cells being disposed at respective intersections of said bit lines and said word lines;

a first decoder for selecting one of said word lines;

a second decoder for selecting at least one of said bit lines; and a complementary pair of data lines for transferring said write data to each said data latch, and for transferring said read data and said write data from each said data latch to said data polarity switch.

13. A method of controlling a semiconductor memory device having non-volatile memory cells and a data latch for storing both write data to be written into said memory cells and read data read from said memory cells, comprising the steps of:

generating a selection signal indicating whether the data stored in said data latch are said read data or said write data;

generating externally readable data by outputting the data stored in said data latch, when said selection signal indicates that said read data are stored; and generating said externally readable data by inverting the data stored in said data latch, when said selection signal indicates that said write data are stored.

14. The method of claim 13, further comprising the step of using said data latch as a sense amplifier when said read data are read from said memory cells.

15. The method of claim 13, further comprising the step of using Fowler-Nordheim tunneling to store said write data in said memory cells.

16. The method of claim 13, further comprising the steps of:

setting said selection signal to a first state when said write data are transferred into said data latch;

leaving said selection signal in said first state until said read data are transferred into said data latch;

setting selection signal to a second state when said read data are transferred into said data latch; and leaving said selection signal in said second state until said write data are transferred into said data latch.

17. The method of claim 16, wherein said step of setting said selection signal to said first state is performed in response to an external control signal.

18. The method of claim 16, wherein said step of setting said selection signal to said second state is performed in response to a signal supplying a read potential to a bit line to which said memory cells are coupled.

19. The method of claim 16, further comprising the step of setting said selection signal to a predetermined one of said first state and said second state when said semiconductor memory device is powered up.

20. The method of claim 13, wherein said semiconductor memory device has a plurality of bit lines to which said memory cells are coupled, one said data latch being provided separately for each of said bit lines, further comprising the step of:

transferring said read data from said memory cells on all of said bit lines simultaneously.

21. The method of claim 20, further comprising the step of transferring said write data to said memory cells on all of said bit lines simultaneously.

22. The method of claim 20, wherein said semiconductor memory device also has a plurality of word lines to which said memory cells are coupled, said memory cells being disposed at respective intersections of said bit lines and said word lines, a first decoder for selecting one of said word lines, and a second decoder for selecting at least one of said bit lines, further comprising the steps of:

transferring said write data to each said data latch through a complementary pair of data lines; and transferring said read data and said write data from each said data latch to said data polarity switch through said complementary pair of data lines.

* * * * *